(12) United States Patent
Loboda et al.

(10) Patent No.: US 7,622,193 B2
(45) Date of Patent: *Nov. 24, 2009

(54) COATED SUBSTRATES AND METHODS FOR THEIR PREPARATION

(75) Inventors: Mark Loboda, Bay City, MI (US); Steven Snow, Sanford, MI (US); William Weidner, Bay City, MI (US); Ludmil Zambov, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 363 days.

This patent is subject to a terminal disclaimer.

(21) Appl. No.: 11/631,579

(22) PCT Filed: Aug. 12, 2005

(86) PCT No.: PCT/US2005/028955

§ 371 (c)(1), (2), (4) Date: Jan. 4, 2007

(87) PCT Pub. No.: WO2006/023437

PCT Pub. Date: Mar. 2, 2006

(65) Prior Publication Data

US 2007/0248768 A1    Oct. 25, 2007

Related U.S. Application Data

(60) Provisional application No. 60/602,404, filed on Aug. 18, 2004.

(51) Int. Cl.
B32B 9/04 (2006.01)

(52) U.S. Cl. ............. 428/446; 428/448; 428/698; 428/221; 428/218; 427/574

(58) Field of Classification Search ............. None
See application file for complete search history.

(56) References Cited

U.S. PATENT DOCUMENTS

| 5,378,510 | A | 1/1995 | Thomas et al. |
| 5,718,967 | A | 2/1998 | Hu et al. |
| 6,159,871 | A | 12/2000 | Loboda et al. |
| 6,593,248 | B2 * | 7/2003 | Loboda et al. ............. 438/758 |
| 6,593,655 | B1 | 7/2003 | Loboda et al. |
| 6,667,553 | B2 | 12/2003 | Cerny et al. |
| 2003/0111662 | A1 * | 6/2003 | Cerny et al. ............. 257/40 |
| 2004/0197474 | A1 * | 10/2004 | Vrtis et al. ............. 427/255.28 |
| 2005/0074961 | A1 * | 4/2005 | Beyer et al. ............. 438/619 |
| 2005/0200025 | A1 * | 9/2005 | Casey et al. ............. 257/762 |
| 2006/0177990 | A1 * | 8/2006 | Beyer et al. ............. 438/421 |

FOREIGN PATENT DOCUMENTS

WO    WO 02 054484 A2    7/2002

OTHER PUBLICATIONS

Hean Ju Lee et al. The mechanical properties of the SiOC(-H) composite thin films with a low dielectric constant. Surface and Coatings Technology. 171 (2003) 296-301.*

* cited by examiner

*Primary Examiner*—Jennifer McNeil
*Assistant Examiner*—Vera Katz
(74) *Attorney, Agent, or Firm*—Timothy J. Troy

(57) ABSTRACT

Coated substrates containing a barrier layer comprising hydrogenated silicon oxycarbide having a density of at least 1.6 g/cm$^3$ and methods of preparing the coated substrates.

7 Claims, 2 Drawing Sheets

COATED SUBSTRATES AND METHODS FOR THEIR PREPARATION

CROSS REFERENCE TO RELATED APPLICATIONS

This application is a U.S. national stage filing under 35 U.S.C. §371 of PCT Application No. PCT/US05/028955 filed on 12 Aug. 2005, currently pending, which claims the benefit of U.S. Provisional Patent Application No. 60/602,404 filed 18 Aug. 2004 under 35 U.S.C. §119 (e). PCT Application No. PCT/US05/028955 and U.S. Provisional Patent Application No. 60/602,404 are hereby incorporated by reference.

FIELD OF THE INVENTION

The present invention relates to coated substrates and more particularly to coated substrates containing a barrier layer comprising hydrogenated silicon oxycarbide having a density of at least 1.6 g/cm$^3$. The present invention also relates to methods of preparing the coated substrates.

BACKGROUND OF THE INVENTION

Barrier coatings play an important role in a wide range of applications including electronic packaging, food packaging, and surface treatment by protecting sensitive materials from air, moisture, and other environmental elements. As a result, such coatings increase the reliability and useful lifespan of many consumer products.

Films of hydrogenated silicon oxycarbide suitable for use as interlayer dielectrics or environmental barriers, and methods for producing such films are known in the art. For example, U.S. Pat. No. 6,159,871 to Loboda et al. discloses a chemical vapor deposition method for producing hydrogenated silicon oxycarbide films comprising introducing a reactive gas mixture comprising a methyl-containing silane and an oxygen providing gas into a deposition chamber containing a substrate and inducing a reaction between the methyl-containing silane and oxygen providing gas at a temperature of 25° C. to 500° C.; wherein there is a controlled amount of oxygen present during the reaction to provide a film comprising hydrogen, silicon, carbon and oxygen having a dielectric constant of 3.6 or less on the substrate.

International Application Publication No. WO 02/054484 to Loboda discloses an integrated circuit comprised of a sub-assembly of solid state devices formed into a substrate made of a semiconducting material, metal wiring connecting the solid state devices, and a diffusion barrier layer formed on at least the metal wiring wherein said diffusion barrier layer is an alloy film having the composition of $Si_wC_xO_yH_z$ where w has a value of 10 to 33, x has a value of 1 to 66, y has a value of 1 to 66, z has a value of 0.1 to 60, and w+x+y+z=100 atomic %.

U.S. Pat. No. 6,593,655 to Loboda et al. discloses a semiconductor device having thereon a film produced by introducing a reactive gas mixture comprising a methyl-containing silane and an oxygen providing gas into a deposition chamber containing a semiconductor device and inducing a reaction between the methyl-containing silane and oxygen providing gas at a temperature of 25° C. to 500° C.; wherein there is a controlled amount of oxygen present during the reaction to provide a film comprising hydrogen, silicon, carbon and oxygen having a dielectric constant of 3.6 or less on the semiconductor device.

U.S. Pat. No. 6,667,553 to Cerny et al. discloses a substrate selected from a liquid crystal device, a light emitting diode display device, and an organic light emitting diode display device having thereon a film produced by introducing a reactive gas mixture comprising a methyl-containing silane and an oxygen providing gas into a deposition chamber containing a substrate and inducing a reaction between the methyl-containing silane and oxygen providing gas at a temperature of 25° C. to 500° C.; wherein there is a controlled amount of oxygen present during the reaction to provide a film comprising hydrogen, silicon, carbon and oxygen having a dielectric constant of 3.6 or less on the substrate and to produce a film having a light transmittance of 95% or more for light with a wavelength in the range of 400 nm to 800 nm.

Although the aforementioned references disclose coatings of hydrogenated silicon oxycarbide having good dielectric and barrier properties, there is a need for dielectric coatings having superior resistance to environmental elements, particularly water vapor and oxygen.

SUMMARY OF THE INVENTION

The present invention is directed to a coated substrate, comprising:
  a substrate; and
  a barrier layer on the substrate, wherein the barrier layer comprises hydrogenated silicon oxycarbide having a density of at least 1.6 g/cm$^3$.

The present invention is also directed to a coated substrate, comprising:
  a substrate;
  a buffer layer on the substrate, wherein the buffer layer comprises hydrogenated silicon oxycarbide having a density less than 1.6 g/cm$^3$; and
  a barrier layer on the buffer layer, wherein the barrier layer comprises hydrogenated silicon oxycarbide having a density of at least 1.6 g/cm$^3$.

The present invention is further directed to a method of preparing a coated substrate, the method comprising:
  introducing a reactive gas mixture comprising a silicon-containing compound, argon, and oxygen into a deposition chamber containing a substrate, wherein the silicon-containing compound is selected from at least one silane, at least one siloxane, and a mixture thereof, the ratio of the flow rate of the argon to the flow rate of the silicon-containing compound is from 10 to 30, the ratio of the flow rate of the oxygen to the flow rate of the silicon-containing compound is from 0.15 to 1.0, the substrate temperature is from 20 to 80° C., and the pressure is from 1.33 to 60 Pa;
  applying an RF power to the gas mixture to generate a plasma, wherein the RF power is from 300 to 1000 W; and
  applying an LF power to the substrate, wherein the LF power is from 50 to 120 W, to deposit a barrier layer comprising hydrogenated silicon oxycarbide having a density of at least 1.6 g/cm$^3$ on the substrate.

The present invention is still further directed to a method of preparing a coated substrate, the method comprising:
  depositing a buffer layer on a substrate, wherein the buffer layer comprises hydrogenated silicon oxycarbide having a density less than 1.6 g/cm$^3$;
  introducing a reactive gas mixture comprising a silicon-containing compound, argon, and oxygen into a deposition chamber containing the substrate having the buffer layer, wherein the silicon-containing compound is selected from at least one silane, at least one siloxane, and a mixture thereof, the ratio of the flow rate of the argon to the flow rate of the silicon-containing compound is from 10 to 30, the ratio of the flow rate of the oxygen to the flow rate of the silicon-containing compound is from 0.15 to 1.0, the substrate temperature is from 20 to 80° C., and the pressure is from 1.33 to 60 Pa;

applying a RF power to the gas mixture to generate a plasma, wherein the RF power is from 300 to 1000 W; and applying an LF power to the substrate, wherein the LF power is from 50 to 120 W, to deposit a barrier layer comprising hydrogenated silicon oxycarbide having a density of at least 1.6 g/cm$^3$ on the buffer layer.

The barrier layer of the present invention has higher density and lower porosity than conventional silicon oxycarbide films. The barrier layer has a low water vapor transmission rate, typically from 10$^{-1}$ to 10$^{-3}$ g/m$^2$/day. Also, the barrier layer has low permeability to oxygen and metal ions, such as copper and aluminum. Further, the barrier layer has high transparency, typically at least 80%, for light in the visible region of the electromagnetic spectrum. Still further, the barrier layer has high resistance to cracking and low compressive stress.

The methods of the present invention can be carried out using conventional equipment and techniques. For example hydrogenated silicon oxycarbide having a density less than 1.6 g/cm$^3$ can be deposited using chemical vapor deposition techniques, such as thermal chemical vapor deposition, plasma enhanced chemical vapor deposition, photochemical vapor deposition, and jet vapor deposition; and physical vapor deposition techniques, such as sputtering. Moreover, hydrogenated silicon oxycarbide having a density of at least 1.6 g/cm$^3$ can be deposited using dual frequency chemical vapor deposition. Importantly, adjacent barrier and buffer layers can be deposited using the same chemical vapor deposition system.

The barrier layer of the present invention can be used as an interlayer dielectric and/or a barrier against moisture and oxygen in numerous devices, including semiconductor devices, liquid crystals, light-emitting diodes, organic light-emitting diodes, optoelectronic devices, optical devices, photovoltaic cells, thin film batteries, and solar cells.

DETAILED DESCRIPTION OF THE INVENTION

Figure 1:
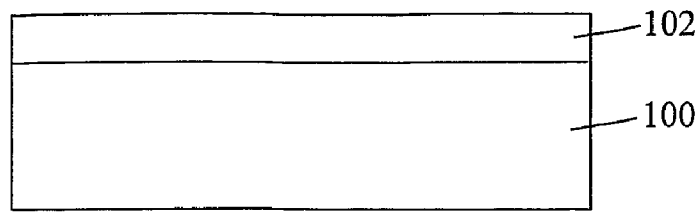
FIG. 1 shows a cross-sectional view of a first embodiment of a coated substrate according the present invention.

As shown in FIG. 1, a first embodiment of a coated substrate according to the present invention comprises a substrate 100; and a barrier layer 102 on the substrate 100, wherein the barrier layer 102 comprises hydrogenated silicon oxycarbide having a density of at least 1.6 g/cm$^3$.

The substrate can be a rigid or flexible material having a planar, complex, or irregular contour. Also, the substrate can be transparent or nontransparent to light in the visible region (~400 to ~700 nm) of the electromagnetic spectrum. As used herein, the term "transparent" means the substrate has a percent transmittance of at least 30%, alternatively at least 60%, alternatively at least 80%, for light in the visible region of the electromagnetic spectrum. Further, the term "nontransparent" means the substrate has a percent transmittance less than 30% for light in the visible region of the electromagnetic spectrum.

Examples of substrates include, but are not limited to, semiconductor materials such as silicon, silicon having a surface layer of silicon dioxide, and gallium arsenide; quartz; fused quartz; aluminum oxide; ceramics; glass; metal foils; polyolefins such as polyethylene, polypropylene, polystyrene, polyethylene terephthalate (PET), and polyethylene naphthalate; fluorocarbon polymers such as polytetrafluoroethylene and polyvinylfluoride; polyamides such as Nylon; polyimides; polyesters such as poly(methyl methacrylate); epoxy resins; polyethers; polycarbonates; polysulfones; and polyether sulfones. The substrate can be a single material or a composite comprising two or more different materials.

The barrier layer comprises hydrogenated silicon oxycarbide typically having a density of at least 1.6 g/cm$^3$, alternatively at least 1.7 g/cm$^3$, alternatively at least 1.8 g/cm$^3$, at 25° C. Typically, the hydrogenated silicon oxycarbide of the barrier layer has a density of from 1.7 to 2.5 g/cm$^3$, alternatively from 1.7 to 2.0 g/cm$^3$, alternatively from 1.8 to 2.0 g/cm$^3$, at 25° C. The density of the hydrogenated silicon oxycarbide can be readily determined by measuring the mass, thickness, and surface area of the deposit.

The hydrogenated silicon oxycarbide of the barrier layer contains silicon, oxygen, carbon, and hydrogen. For example, the hydrogenated silicon oxycarbide may be represented by the formula $Si_mO_nC_pH_q$ wherein m has value of from 10 to 33 atomic %, alternatively from 18 to 25 atomic %; n has a value of from 1 to 66 atomic %, alternatively from 10 to 20 atomic %; p has a value of from 1 to 66 atomic %, alternatively from 15 to 38 atomic %; q has a value of from 0.1 to 60 atomic %, alternatively from 25 to 40 atomic %; and m+n+p+q=100 atomic %.

The barrier layer typically has a thickness of from 0.2 to 10 µm, alternatively from 0.2 to 5 µm, alternatively from 0.2 to 2 µm. When the thickness of the barrier layer is less than 0.2 µm, the water vapor transmission rate of the layer typically increases. When the thickness of the barrier layer is greater than 10 µm, the layer may be susceptible to cracking.

The barrier layer typically has a percent transmittance of at least 30%, alternatively at least 50%, alternatively at least 70%, for light in the visible region (~400 to ~700 nm) of the electromagnetic spectrum. For example a barrier layer having a thickness of 1 µm on a polyethylene terephthalate substrate having a thickness of 150 µm is typically at least 70%.

Figure 2:
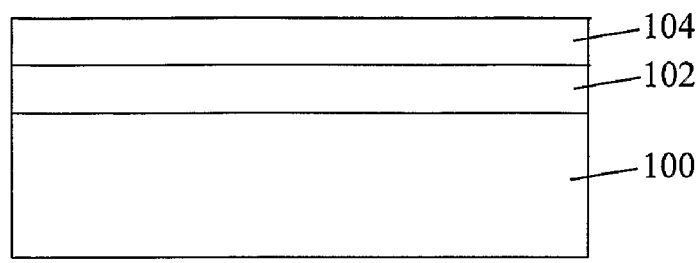
FIG. 2 shows a cross-sectional view of a second embodiment of a coated substrate according the present invention.

As shown in FIG. 2, a second embodiment of a coated substrate comprises a substrate 100; a barrier layer 102 on the substrate 100, wherein the barrier layer 102 comprises hydrogenated silicon oxycarbide having a density of at least 1.6 g/cm$^3$; and a buffer layer 104 on the barrier layer 102, wherein the buffer layer 104 comprises hydrogenated silicon oxycarbide having a density less than 1.6 g/cm$^3$. The substrate and barrier layer of the second embodiment are as described above for the first embodiment of the coated substrate.

The buffer layer comprises hydrogenated silicon oxycarbide typically having a density less than 1.6 g/cm$^3$, alternatively less than 1.4 g/cm$^3$, at 25° C. Typically, the hydrogenated silicon oxycarbide of the buffer layer has a density of from 1.0 to 1.5 g/cm$^3$, alternatively from 1.1 to 1.5 g/cm$^3$, alternatively from 1.2 to 1.5 g/cm$^3$, at 25° C. The density of the hydrogenated silicon oxycarbide can be readily determined by measuring the mass, thickness, and surface area of the deposit.

The hydrogenated silicon oxycarbide of the buffer layer contains silicon, oxygen, carbon, and hydrogen and may be represented by the formula given above for the hydrogenated silicon oxycarbide of the barrier layer.

The buffer layer typically has a thickness of from 0.2 to 10 μm, alternatively from 0.2 to 5 μm, alternatively from 0.2 to 2 μm. When the thickness of the buffer layers is less than 0.2 μm, the buffer layer may not provide adequate coverage of the barrier layer. When the thickness of the buffer layer is greater than 10 μm, the layer may be susceptible to cracking.

The buffer layer typically has a percent transmittance of at least 60%, alternatively at least 70%, alternatively at least 80%, for light in the visible region (~400 to ~700 nm) of the electromagnetic spectrum. For example a buffer layer having a thickness of 1 μm on a polyethylene terephthalate substrate having a thickness of 150 μm is typically at least 80%.

Figure 3:
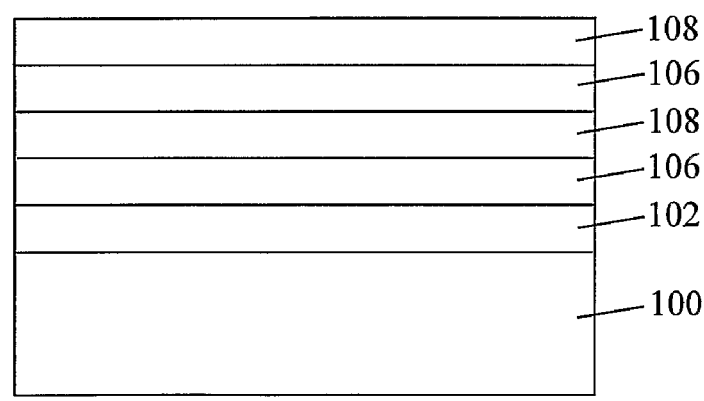
FIG. 3 shows a cross-sectional view of a third embodiment of a coated substrate according the present invention.

As shown in FIG. 3, a third embodiment of a coated substrate comprises a substrate 100; a barrier layer 102 on the substrate 100, wherein the barrier layer 102 comprises hydrogenated silicon oxycarbide having a density of at least 1.6 g/cm$^3$; and at least two (four shown) alternating buffer 106 and barrier 108 layers, on the barrier layer 102, wherein each alternating buffer layer 106 comprises hydrogenated silicon oxycarbide having a density less than 1.6 g/cm$^3$, and each alternating barrier layer 108 comprises hydrogenated silicon oxycarbide having a density of at least 1.6 g/cm$^3$. The third embodiment of the coated substrate typically comprises from 2 to 16, alternatively from 4 to 10, alternating buffer and barrier layers on the barrier layer. The substrate and barrier layer of the third embodiment are as described above for the first embodiment. Also, each alternating buffer layer and barrier layer of the third embodiment are as described above for the buffer layer of the second embodiment and the barrier layer of first embodiment, respectively.

Figure 4:
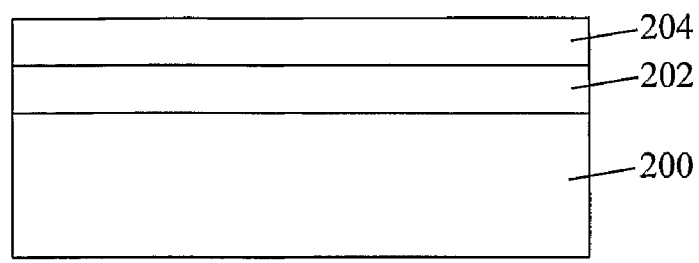
FIG. 4 shows a cross-sectional view of a fourth embodiment of a coated substrate according the present invention.

As shown in FIG. 4, a fourth embodiment of a coated substrate comprises a substrate 200; a buffer layer 202 on the substrate 200, wherein the buffer layer 202 comprises hydrogenated silicon oxycarbide having a density less than 1.6 g/cm$^3$; and a barrier layer 204 on the buffer layer 202, wherein the barrier layer 204 comprises hydrogenated silicon oxycarbide having a density of at least 1.6 g/cm$^3$. The substrate and barrier layer of the fourth embodiment are as described above for the first embodiment. Also, the buffer layer of the fourth embodiment is as described above for the second embodiment.

Figure 5:
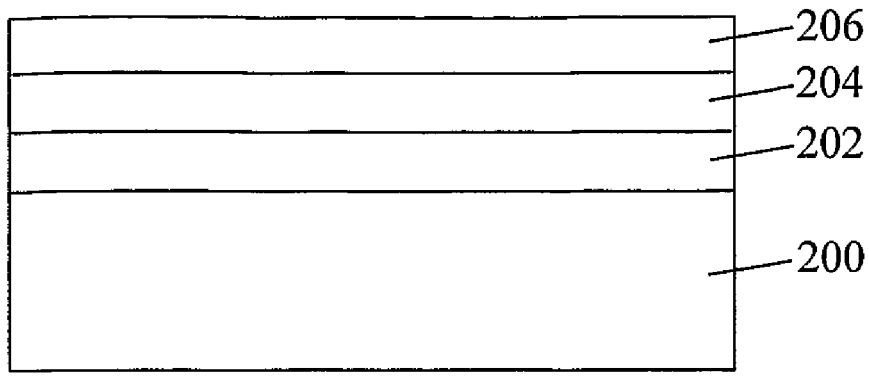
FIG. 5 shows a cross-sectional view of a fifth embodiment of a coated substrate according the present invention.

As shown in FIG. 5, a fifth embodiment of a coated substrate comprises a substrate 200; a buffer layer 202 on the substrate 200, wherein the buffer layer 202 comprises hydrogenated silicon oxycarbide having a density less than 1.6 g/cm$^3$; a barrier layer 204 on the buffer layer 202, wherein the barrier layer 204 comprises hydrogenated silicon oxycarbide having a density of at least 1.6 g/cm$^3$; and an additional buffer layer 206 on the barrier layer 204, wherein the additional buffer layer 206 comprises hydrogenated silicon oxycarbide having a density less than 1.6 g/cm$^3$. The substrate and barrier layer of the fifth embodiment are as described above for the first embodiment. Also, the buffer layer and additional buffer layer of the fifth embodiment are as described above for the buffer layer of the second embodiment.

Figure 6:
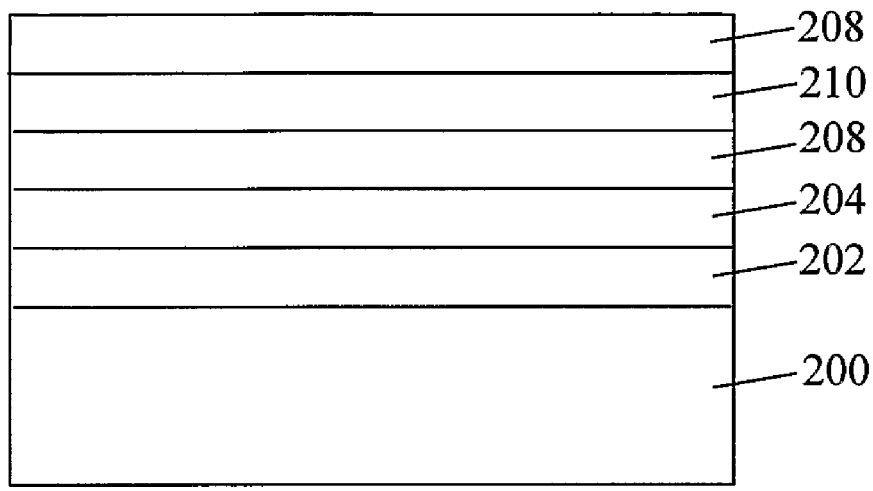
FIG. 6 shows a cross-sectional view of a sixth embodiment of a coated substrate according the present invention.

As shown in FIG. 6, a sixth embodiment of a coated substrate comprises a substrate 200; a buffer layer 202 on the substrate 200, wherein the buffer layer 202 comprises hydrogenated silicon oxycarbide having a density less than 1.6 g/cm$^3$; a barrier layer 204 on the buffer layer 202, wherein the barrier layer 204 comprises hydrogenated silicon oxycarbide having a density of at least 1.6 g/cm$^3$; and at least two (three shown) alternating buffer 208 and barrier 210 layers, on the barrier layer 204, wherein each alternating buffer layer 208 comprises hydrogenated silicon oxycarbide having a density less than 1.6 g/cm$^3$, and each alternating barrier layer 210 comprises hydrogenated silicon oxycarbide having a density of at least 1.6 g/cm$^3$. The sixth embodiment of the coated substrate typically comprises from 3 to 15, alternatively from 3 to 7, alternating buffer and barrier layers on the barrier layer. The substrate, barrier layer, and each alternating barrier layer of the sixth embodiment are as described above for the barrier layer of the first embodiment. Also, the buffer layer and each alternating buffer layer of the sixth embodiment are as described above for the buffer layer of the second embodiment.

The first embodiment of a coated substrate according to the present invention (FIG. 1) can be prepared by introducing a reactive gas mixture comprising a silicon-containing compound, argon, and oxygen into a deposition chamber containing a substrate 100, wherein the silicon-containing compound is selected from at least one silane, at least one siloxane, and a mixture thereof, the ratio of the flow rate of the argon to the flow rate of the silicon-containing compound is from 10 to 30, the ratio of the flow rate of the oxygen to the flow rate of the silicon-containing compound is from 0.15 to 1.0, the substrate temperature is from 20 to 80° C., and the pressure is from 1.33 to 60 Pa; applying an RF power to the gas mixture to generate a plasma, wherein the RF power is from 300 to 1000 W; and applying an LF power to the substrate, wherein the LF power is from 50 to 120 W, to deposit a barrier layer 102 comprising hydrogenated silicon oxycarbide having a density of at least 1.6 g/cm$^3$ on the substrate 100.

In the first step of the method, a reactive gas mixture comprising a silicon-containing compound, argon, and oxygen is introduced into a deposition chamber containing a substrate, wherein the silicon-containing compound is selected from at least one silane, at least one siloxane, and a mixture thereof, the ratio of the flow rate of the argon to the flow rate of the silicon-containing compound is from 10 to 30, the ratio of the flow rate of the oxygen to the flow rate of the silicon-containing compound is from 0.15 to 1.0, the substrate temperature is from 20 to 80° C., and the pressure is from 1.33 to 60 Pa.

The silicon-containing compound of the reactive gas mixture is selected from at least one silane, at least one siloxane, and a mixture thereof. Examples of silanes include, but are not limited to, methyl-containing silanes, such as methylsilane, dimethylsilane, trimethylsilane, and tetramethylsilane; and alkoxysilanes, such as dimethoxydimethylsilane, trimethoxymethylsilane, tetramethoxysilane, triethoxymethylsilane, diethoxydimethylsilane, triethoxymethylsilane, triethoxyvinylsilane, tetraethoxysilane, dimethoxymethylphenylsilane, trimethoxyphenylsilane, 3-glycidoxypropyltrimethoxysilane, 3-methacryloxypropyltrimethoxysilane, diethoxymethylphenylsilane, tris(2-methoxyethoxy)vinylsilane, triethoxyphenylsilane, and dimethoxydiphenylsilane. Examples of siloxanes include, but are not limited to, tetramethyldisiloxane, hexamethyldisiloxane, and tetraethoxysilane. The silicon-containing compound can be a single silane, a mixture of two or more different silanes, a single siloxane, a mixture of two or more different siloxanes, or a mixture of at least one silane and at least one siloxane.

The method of the present invention can be carried out using a conventional parallel plate chemical vapor deposition system operating in a dual frequency mode. In such systems, the deposition chamber contains a top electrode, typically the shower head, connected to a radiofrequency (RF) power source and a bottom electrode, typically the substrate holder, connected to a low frequency (LF) power source. The RF power source typically provides a power of from 10 to 1000

W at a frequency of from 1 to 20 MHz. An RF frequency of 13.56 MHz is generally employed in CVD systems. The LF power source typically provides a power of from 10 to 1200 W at a frequency of from 325 to 375 KHz. Also, filtering is typically employed to minimize the interaction between the two signals. For example an inductor and a capacitor are typically used to ground the top and the bottom electrodes, respectively.

The flow rate of the silicon-containing compound is typically from 20 to 150 sccm (standard cubic centimeters per minute), alternatively from 30 to 120 sccm, alternatively from 30 to 80 sccm.

The flow rate of the argon is typically from 200 to 1500 sccm, alternatively from 300 to 1200 sccm, alternatively from 300 to 800 sccm.

The flow rate of the oxygen is typically from 5 to 100 sccm, alternatively from 5 to 60 sccm, alternatively from 5 to 40 sccm.

The ratio of the flow rate of the argon to the flow rate of the silicon-containing compound is typically from 10 to 30, alternatively from 10 to 20, alternatively from 10 to 15. When the ratio of the flow rate of the argon to the flow rate of the silicon-containing compound is greater than 30 sccm, a substantial increase in substrate temperature may occur.

The ratio of the flow rate of the oxygen to the flow rate of the silicon-containing compound is typically from 0.15 to 1.0, alternatively from 0.5 to 1.0, alternatively from 0.5 to 0.8. When the ratio of the flow rate of the oxygen to the flow rate of the silicon-containing compound is less than 0.15, the barrier layer may largely comprise silicon carbide. When the ratio of the flow rate of the oxygen to the flow rate of the silicon-containing compound is greater than 1.0, the water vapor transmission rate of the layer typically increases.

The substrate temperature is typically from 20 to 80° C., alternatively from 25 to 50° C., alternatively from 25 to 40° C.

The deposition pressure is typically from 1.33 to 60 Pa, alternatively from 1.33 to 25 Pa, alternatively from 1.33 to 15 Pa. When the pressure is greater than 60 Pa, the water vapor transmission rate of the layer typically increases.

In the second step of the method, an RF power is applied to the gas mixture to generate a plasma, wherein the RF power is from 300 to 1000 W. Alternatively, the RF power is from 400 to 800 W or from 400 to 600 W.

In the third step of the method, an LF power is applied to the substrate, wherein the LF power is from 50 to 120 W, to produce a barrier layer having a density of at least 1.6 g/cm$^3$ on the substrate. Alternatively, the LF power is from 60 to 100 W or from 65 to 85 W.

The second embodiment of a coated substrate (FIG. 2) can be prepared by depositing a barrier layer 102 on a substrate 100, wherein the barrier layer 102 comprises hydrogenated silicon oxycarbide having a density of at least 1.6 g/cm$^3$; and depositing a buffer layer 104 on the barrier layer 102, wherein the buffer layer 104 comprises hydrogenated silicon oxycarbide having a density less than 1.6 g/cm$^3$. The barrier layer of the second embodiment can be deposited as described above for the first embodiment.

Methods of depositing the buffer layer comprising hydrogenated silicon oxycarbide having a density less than 1.6 g/cm$^3$ are well known in the art, as exemplified in U.S. Pat. No. 6,159,871 to Loboda et al.; WO 02/054484 A2 to Loboda; U.S. Pat. No. 5,718,967 to Hu et al.; and U.S. Pat. No. 5,378,510 to Thomas et al. For example, hydrogenated silicon oxycarbide films having a density up to about 1.4 g/cm$^3$ can be deposited by chemical vapor deposition as described in U.S. Pat. No. 6,159,871. Briefly, this method involves introducing a reactive gas mixture comprising a methyl-containing silane and an oxygen-providing gas into a deposition chamber containing a substrate and inducing a reaction between the methyl-containing silane and the oxygen-providing gas at a temperature of 25 to 500° C.; wherein there is a controlled amount of oxygen present during the reaction to provide a film comprising hydrogen, silicon, carbon, and oxygen having a dielectric constant of 3.6 or less on the substrate. Examples of methyl-containing silanes include methyl silane, dimethylsilane, trimethylsilane, and tetramethylsilane. Examples of oxygen-providing gases include, but are not limited to, air, ozone, oxygen, nitrous oxide, and nitric oxide.

The amount of oxygen present during the deposition process can be controlled by selection of the type and/or amount of the oxygen-providing gas. The concentration of oxygen-providing gas is typically less than 5 parts per volume, alternatively from 0.1 to 4.5 parts per volume, per 1 part per volume of the methyl-containing silane. When the concentration of oxygen is too high, the process forms a silicon oxide film with a stoichiometry close to $SiO_2$. When the concentration of oxygen is too low, the process forms a silicon carbide film with a stoichiometry close to SiC. The optimum concentration of the oxygen-containing gas for a particular application can be readily determined by routine experimentation.

Hydrogenated silicon oxycarbide films having a density between 1.4 and 1.6 g/cm$^3$ can be prepared by introducing a reactive gas mixture comprising a silicon-containing compound, argon, and oxygen into a deposition chamber containing the substrate having the barrier layer, wherein the silicon-containing compound is selected from at least one silane, at least one siloxane, and a mixture thereof, the ratio of the flow rate of the argon to the flow rate of the silicon-containing compound is from 1 to 10, the ratio of the flow rate of the oxygen to the flow rate of the silicon-containing compound is from 0.5 to 2.0, the substrate temperature is from 25 to 50° C., and the pressure is from 5 to 40 Pa; applying an RF power to the gas mixture to generate a plasma, wherein the RF power is from 150 to 300 W; and applying an LF power to the substrate, wherein the LF power is from 15 to 30 W.

The third embodiment of a coated substrate (FIG. 3) can be prepared by depositing a barrier layer 102 on a substrate 100, wherein the barrier layer 102 comprises hydrogenated silicon oxycarbide having a density of at least 1.6 g/cm$^3$; and depositing at least two (four shown) alternating buffer 106 and barrier 108 layers, on the barrier layer 102, wherein each alternating buffer layer 106 comprises hydrogenated silicon oxycarbide having a density less than 1.6 g/cm$^3$, and each alternating barrier layer 108 comprises hydrogenated silicon oxycarbide having a density of at least 1.6 g/cm$^3$. The barrier layer and each alternating barrier layer of the third embodiment can be deposited as described above for the barrier layer of the first embodiment. Also, each alternating buffer layer of the third embodiment can be deposited as described above for the buffer layer of the second embodiment.

The fourth embodiment of a coated substrate (FIG. 4) of the present invention can be prepared by depositing a buffer layer 202 on a substrate 200, wherein the buffer layer 202 comprises hydrogenated silicon oxycarbide having a density less than 1.6 g/cm$^3$; introducing a reactive gas mixture comprising a silicon-containing compound, argon, and oxygen into a deposition chamber containing the substrate 200 having the buffer layer 202, wherein the silicon-containing compound is selected from at least one silane, at least one siloxane, and a mixture thereof, the ratio of the flow rate of the argon to the flow rate of the silicon-containing compound is from 10 to 30, the ratio of the flow rate of the oxygen to the flow rate of the silicon-containing compound is from 0.15 to 1.0, the substrate temperature is from 20 to 80° C., and the pressure is from 1.33 to 60 Pa; applying an RF power to the gas mixture to generate a plasma, wherein the RF power is from 300 to 1000 W; and applying an LF power to the substrate, wherein the LF power is from 50 to 120 W, to deposit a barrier layer 204 comprising hydrogenated silicon oxycarbide having a density of at least 1.6 g/cm$^3$ on the buffer layer 202. The buffer layer of the fourth embodiment can be deposited as described above for the buffer layer of the second embodiment. Also, the barrier layer of the fourth embodiment can be deposited as described above for the barrier layer of the first embodiment.

The fifth embodiment of the coated substrate (FIG. 5) can be prepared by depositing a buffer layer 202 on a substrate 200, wherein the buffer layer 202 comprises hydrogenated silicon oxycarbide having a density less than 1.6 g/cm$^3$; depositing a barrier layer 204 on the buffer layer 202, wherein the barrier layer 204 comprises hydrogenated silicon oxycarbide having a density of at least 1.6 g/cm$^3$; and depositing an additional buffer layer 206 on the barrier layer 204, wherein the additional buffer layer 206 comprises hydrogenated silicon oxycarbide having a density less than 1.6 g/cm$^3$. The barrier layer of the fifth embodiment can be deposited as described above for the barrier layer of the first embodiment. Also, the buffer layer and additional buffer layer of the fifth embodiment can be deposited as described above for the buffer layer of the second embodiment.

The sixth embodiment of the coated substrate (FIG. 6) can be prepared by depositing a buffer layer 202 on a substrate 200, wherein the buffer layer 202 comprises hydrogenated silicon oxycarbide having a density less than 1.6 g/cm$^3$; depositing a barrier layer 204 on the buffer layer 202, wherein the barrier layer 204 comprises hydrogenated silicon oxycarbide having a density of at least 1.6 g/cm$^3$; and depositing at least two (three shown) alternating, buffer 208 and barrier 210 layers, on the barrier layer 204, wherein each alternating buffer layer 208 comprises hydrogenated silicon oxycarbide having a density less than 1.6 g/cm$^3$, and each alternating barrier layer 210 comprises hydrogenated silicon oxycarbide having a density of at least 1.6 g/cm$^3$. The barrier layer and each alternating barrier layer of the sixth embodiment can be deposited as described above for the barrier layer of the first embodiment. Also, the buffer layer and each alternating buffer layer of the sixth embodiment can be deposited as described above for the buffer layer of the second embodiment.

The barrier layer of the present invention has higher density and lower porosity than conventional silicon oxycarbide films. The barrier layer has a low water vapor transmission rate, typically from $10^{-1}$ to $10^{-3}$ g/m$^2$/day. Also, the barrier layer has low permeability to oxygen and metal ions, such as copper and aluminum. Further, the barrier layer has high transparency, typically at least 80%, for light in the visible region of the electromagnetic spectrum. Still further, the barrier layer has high resistance to cracking and low compressive stress.

The methods of the present invention can be carried out using conventional equipment and techniques. For example hydrogenated silicon oxycarbide having a density less than 1.6 g/cm$^3$ can be deposited using chemical vapor deposition techniques, such as thermal chemical vapor deposition, plasma enhanced chemical vapor deposition, photochemical vapor deposition, and jet vapor deposition; and physical vapor deposition techniques, such as sputtering and electron beam evaporation. Moreover, hydrogenated silicon oxycarbide having a density of at least 1.6 g/cm$^3$ can be deposited using dual frequency chemical vapor deposition. Importantly, adjacent barrier and buffer layers can be deposited using the same chemical vapor deposition system.

The barrier layer of the present invention can be used as an interlayer dielectric and/or a barrier against moisture and oxygen in numerous devices, including semiconductor devices, liquid crystals, light-emitting diodes, organic light-emitting diodes, optoelectronic devices, optical devices, photovoltaic cells, thin film batteries, and solar cells.

EXAMPLES

The following examples are presented to better illustrate the coated substrates and methods of the present invention, but are not to be considered as limiting the invention, which is delineated in the appended claims.

The buffer and barrier layers in the Examples were deposited using a Model No. 2212 HDP parallel plate chemical vapor deposition system from Applied Process Technologies (Tucson, Ariz.) operating in a dual frequency mode at a substrate temperature of 25° C., a pressure of 0.09 Torr (12.0 Pa), an RF power source connected to the top electrode (shower head) and an LF power source connected to the bottom electrode (substrate holder).

The deposition chamber was thoroughly cleaned before the preparation of each coated substrate by first plasma etching the interior surfaces of the chamber for 5 to 10 min. using a plasma generated from $CF_4$ and $O_2$ at a pressure of 40 Pa, a $CF_4$ flow rate of 500 sccm, an $O_2$ flow rate of 100 sccm, an LF power of 40 W, and an RF power of 500 W. After plasma etching, the walls of the chamber were wiped with isopropyl alcohol, and dried with nitrogen.

The polyethylene terephthalate (PET) substrates in the Examples (coated and uncoated) were treated with an argon plasma for 30 s at a pressure of 12.0 Pa, an argon flow rate of 500 sccm, an LF power of 40 W, and an RF power of 300 W.

Water vapor transmission rates (WVTR) of coated and uncoated PET substrates were determined using a MOCON PERMATRAN-W Permeation Test System at a temperature of 37.8° C. and a relative humidity of 90%. Coated PET test specimens were clamped into the diffusion cell, which was then purged with moisture-free nitrogen (10 sccm) until a stable water vapor transmission rate was established.

Compressive stress of buffer and barrier layers was determined using a Tencor FLX-2320 (KLA Tencor, Milpitas, Calif.) Thin Film Stress Measurement System in a control atmosphere of nitrogen at temperature of 18-22° C.

Density of buffer and barrier layers was determined by measuring the mass, thickness, and surface area of a film deposited on a circular substrate having a diameter of 10.2 cm. The mass of a layer was determined using an analytical balance having an accuracy of $1 \times 10^{-5}$ g under ambient conditions (25° C., 101.3 kPa).

Film thickness and refractive index were been determined using a Spectroscopic Ellipsometer (J.A. Woollam Co., Inc., Lincoln, Nebr.) operating under ambient conditions. Test specimens were prepared by deposing films on p-Si wafers having a diameter of 10.2 cm and resistivity greater than 5 ohm·cm.

Examples 1-5

In each of Examples 1-4, coated substrates having the following multilayer structures were prepared using the process conditions shown in Table 1:

Example 1 PET/Buffer/Barrier/Buffer/Barrier
Example 2 PET/Buffer/Barrier/Buffer/Barrier/Buffer
Example 3 PET/Buffer/Barrier/Buffer/Barrier/Buffer Example 4 PET/Buffer/Barrier/Buffer/Barrier/Buffer/Barrier/Buffer where PET refers to a circular sheet of plasma-treated polyethylene terephthalate (see above) having a diameter of 20 cm and a thickness of 50 μm (Example 1) or 175 μm (Examples 2-4), Buffer refers to a buffer layer of hydrogenated silicon oxycarbide having a density of 1.5 g/cm³, and Barrier refers to a barrier layer of hydrogenated silicon oxycarbide having a density of about 1.8-1.9 g/cm³. In Example 5, the water vapor transmission rate (WVTR) of an uncoated plasma-treated PET substrate having a diameter of 10 cm and a thickness of 175 μm was measured for comparison with the coated substrates of Examples 1-4. The properties of the buffer and barrier layers of the coated substrates are shown in Table 1 and the properties of the uncoated and coated substrates are shown in Table 2.

TABLE 1

| | | Process Parameters | | | | | | Film Properties | | |
| | | Gas Flow Rate, sccm | | | Power, W | | DR, | T, | | Stress, | d, |
| Ex. | Type of Layer | TMS | Ar | O₂ | LF | RF | nm/min. | nm | RI | MPa | g/cm³ |
|---|---|---|---|---|---|---|---|---|---|---|---|
| 1 | buffer | 30 | 180 | 25 | 20 | 280 | 200 | 200 | 1.5 | 40 | 1.5 |
| | barrier | 40 | 800 | 25 | 65 | 400 | 200 | 300 | 1.72 | 150 | 1.8 |
| 2 | buffer | 30 | 180 | 25 | 20 | 280 | 200 | 400 | 1.5 | 40 | 1.5 |
| | barrier | 40 | 800 | 20 | 85 | 600 | 225 | 450 | 1.87 | 415 | 1.9 |
| 3 | buffer | 30 | 180 | 25 | 20 | 280 | 200 | 500 | 1.5 | 40 | 1.5 |
| | barrier | 40 | 800 | 20 | 85 | 600 | 225 | 500 | 1.87 | 415 | 1.9 |
| 4 | buffer | 30 | 180 | 25 | 20 | 280 | 200 | 500 | 1.5 | 40 | 1.5 |
| | barrier | 40 | 800 | 20 | 85 | 600 | 225 | 500 | 1.87 | 415 | 1.9 |

TMS is trimethylsilane, LF is low frequency, RF is radiofrequency, DR is deposition rate, T is average thickness, RI is refractive index, Stress refers to compressive stress, and d is density.

TABLE 2

| | Properties of Coated Substrate | |
| Example | WVTR g/m²/day | Coating Thickness μm |
|---|---|---|
| 1 | 0.084 | 1.0 |
| 2 | 0.026 | 2.1 |
| 3 | 0.007-0.01 | 2.5 |
| 4 | <1 × 10⁻³ | 3.5 |
| 5 | 3.2 | uncoated |

WVTR is water vapor transmission rate, Coating Thickness refers to the total thickness of the buffer and barrier layers combined, and uncoated refers to an uncoated PET substrate.

That which is claimed is:

1. A coated substrate, comprising:
   a substrate; and
   a barrier layer on the substrate, wherein the barrier layer comprises hydrogenated silicon oxycarbide having a density of at least 1.6 g/cm³ and a formula $Si_mO_nC_pH_q$ wherein m has a value of from 10 to 33 atomic %, n has a value of from 1 to 66 atomic %, p has a value of from 1 to 66 atomic %, q has a value of from 0.1 to 60 atomic %, and m+n+p+q=100 atomic %, further comprising a buffer layer on the barrier layer, wherein the buffer layer comprises hydrogenated silicon oxycarbide having a density less than 1.6 g/cm³.

2. The coated substrate according to claim 1, further comprising at least two alternating buffer and barrier layers, on the barrier layer, wherein each alternating buffer layer comprises hydrogenated silicon oxycarbide having a density less than 1.6 g/cm³ and each alternating barrier layer comprises hydrogenated silicon oxycarbide having a density of at least 1.6 g/cm³ and a formula $Si_mO_nC_pH_q$ wherein m has a value of from 10 to 33 atomic %, n has a value of from 1 to 66 atomic %, p has a value of from 1 to 66 atomic %, q has a value of from 0.1 to 60 atomic %, and m+n+p+q=100 atomic %.

3. A method of preparing a coated substrate according to claim 1, the method comprising:
   introducing a reactive gas mixture comprising a silicon-containing compound, argon, and oxygen into a deposition chamber containing a substrate, wherein the silicon-containing compound is selected from at least one silane, at least one siloxane, and a mixture thereof, a ratio of a flow rate of the argon to a flow rate of the silicon-containing compound is from 10 to 30, a ratio of a flow rate of the oxygen to a flow rate of the silicon-containing compound is from 0.15 to 1.0, a substrate temperature is from 20 to 80° C., and a pressure is from 1.33 to 60 Pa;
   applying an RF power to the gas mixture to generate a plasma, wherein the RF power is from 300 to 1000 W; and
   applying an LF power to the substrate, wherein the LF power is from 50 to 120 W, to deposit a barrier layer comprising hydrogenated silicon oxycarbide having a density of at least 1.6 g/cm³ on the substrate.

4. A coated substrate, comprising:
   a substrate;
   a buffer layer on the substrate, wherein the buffer layer comprises hydrogenated silicon oxycarbide having a density less than 1.6 g/cm³; and
   a barrier layer on the buffer layer, wherein the barrier layer comprises hydrogenated silicon oxycarbide having a density of at least 1.6 g/cm³ and a formula $Si_mO_nC_pH_q$ wherein m has a value of from 10 to 33 atomic %, n has a value of from 1 to 66 atomic %, p has a value of from 1 to 66 atomic %, q has a value of from 0.1 to 60 atomic %, and m+n+p+q=100 atomic %.

5. The coated substrate according to claim 4, further comprising an additional buffer layer on the barrier layer, wherein the additional buffer layer comprises hydrogenated silicon oxycarbide having a density less than 1.6 g/cm³.

6. The coated substrate according to claim 4, further comprising at least two alternating buffer and barrier layers, on the barrier layer, wherein each alternating buffer layer comprises hydrogenated silicon oxycarbide having a density less than 1.6 g/cm$^3$ and each alternating barrier layer comprises hydrogenated silicon oxycarbide having a density of least 1.6 g/cm$^3$ and a formula $Si_mO_nC_pH_q$ wherein m has a value of from 10 to 33 atomic %, n has a value of from 1 to 66 atomic %, p has a value of from 1 to 66 atomic %, q has a value of from 0.1 to 60 atomic %, and m+n+p+q=100 atomic %.

7. A method of preparing a coated substrate according to claim 4, the method comprising:

depositing a buffer layer on a substrate, wherein the buffer layer comprises hydrogenated silicon oxycarbide having a density less than 1.6 g/cm$^3$;

introducing a reactive gas mixture comprising a silicon-containing compound, argon, and oxygen into a deposition chamber containing the substrate having the buffer layer, wherein the silicon-containing compound is selected from at least one silane, at least one siloxane, and a mixture thereof, the ratio of a flow rate of a argon to the flow rate of a silicon-containing compound is from 10 to 30, a ratio of a flow rate of the oxygen to a flow rate of the silicon-containing compound is from 0.15 to 1.0, a substrate temperature is from 20 to 80° C., and a pressure is from 1.33 to 60 Pa;

applying a RF power to the gas mixture to generate a plasma, wherein the RF power is from 300 to 1000 W; and applying an LF power to the substrate, wherein the LF power is from 50 to 120 W, to deposit a barrier layer comprising hydrogenated silicon oxycarbide having a density of at least 1.6 g/cm$^3$ on the buffer layer.

* * * * *